US006385756B1

(12) United States Patent
Braun

(10) Patent No.: US 6,385,756 B1
(45) Date of Patent: May 7, 2002

(54) SELECTION OF FUNCTIONS WITHIN AN INTEGRATED CIRCUIT

(75) Inventor: David P. Braun, Irvine, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/274,990

(22) Filed: Mar. 23, 1999

(51) Int. Cl.[7] .............................................. G06F 17/50
(52) U.S. Cl. ................................................ 716/1; 716/8
(58) Field of Search ............................... 716/17, 1–21; 257/784, 786, 787, 734, 666; 228/180.5, 4.5; 361/222, 813

(56) References Cited

U.S. PATENT DOCUMENTS

| | | | |
|---|---|---|---|
| 5,023,843 A | * 6/1991 | Love | 365/222 |
| 5,161,124 A | * 11/1992 | Love | 365/222 |
| 5,303,180 A | * 4/1994 | McAdams | 365/63 |
| 5,646,451 A | * 7/1997 | Freyman et al. | 257/784 |
| 5,903,443 A | * 5/1999 | Schoenfeld et al. | 361/813 |
| 6,052,289 A | * 4/2000 | Schoenfeld et al. | 361/813 |
| 6,107,677 A | * 8/2000 | Schoenfeld et al. | 361/813 |

OTHER PUBLICATIONS

Robe et al, "A Sonet STS–3c User Network Interface Integrated Circuit," IEEE, Jun. 1991, pp. 732–740.*

* cited by examiner

Primary Examiner—Vuthe Siek
(74) Attorney, Agent, or Firm—Akin, Gump, Strauss, Hauer & Feld, L.L.P.

(57) ABSTRACT

A functionality selection system that selects the operation of a function within a semiconductor device. The semiconductor device is capable of performing a plurality of functions. The functions are already embedded in the semiconductor device and available for selection. The functionality selection system operates prior to encapsulation of the semiconductor device. The availability of performing the functionality selection just prior to encapsulation provides numerous advantages over conventional functionality selection systems. By performing the selection of the semiconductor device's functionality to just prior to encapsulation, the lag time between a customer's order and a shipment of the semiconductor device is shortened. The lag time can be shortened to only two weeks in contrast to many conventional selection systems that have lag times as long as three months. The invention is also a functionality identification system. A semiconductor device having a selected functionality is input into the functionality identification system, and the bonding arrangement of the semiconductor device is used to identify the semiconductor device. The invention also includes a method for performing the selection of a particular functionality within a semiconductor device. The invention also provides for a security system that couples a specific software to a specific hardware. In this embodiment of the invention, the invention serves as a key that ensures that the specific software is not loaded indiscriminately on just any given hardware, but that software from a specific source or group of sources is operative only with hardware from the specific source or group of sources.

2 Claims, 8 Drawing Sheets

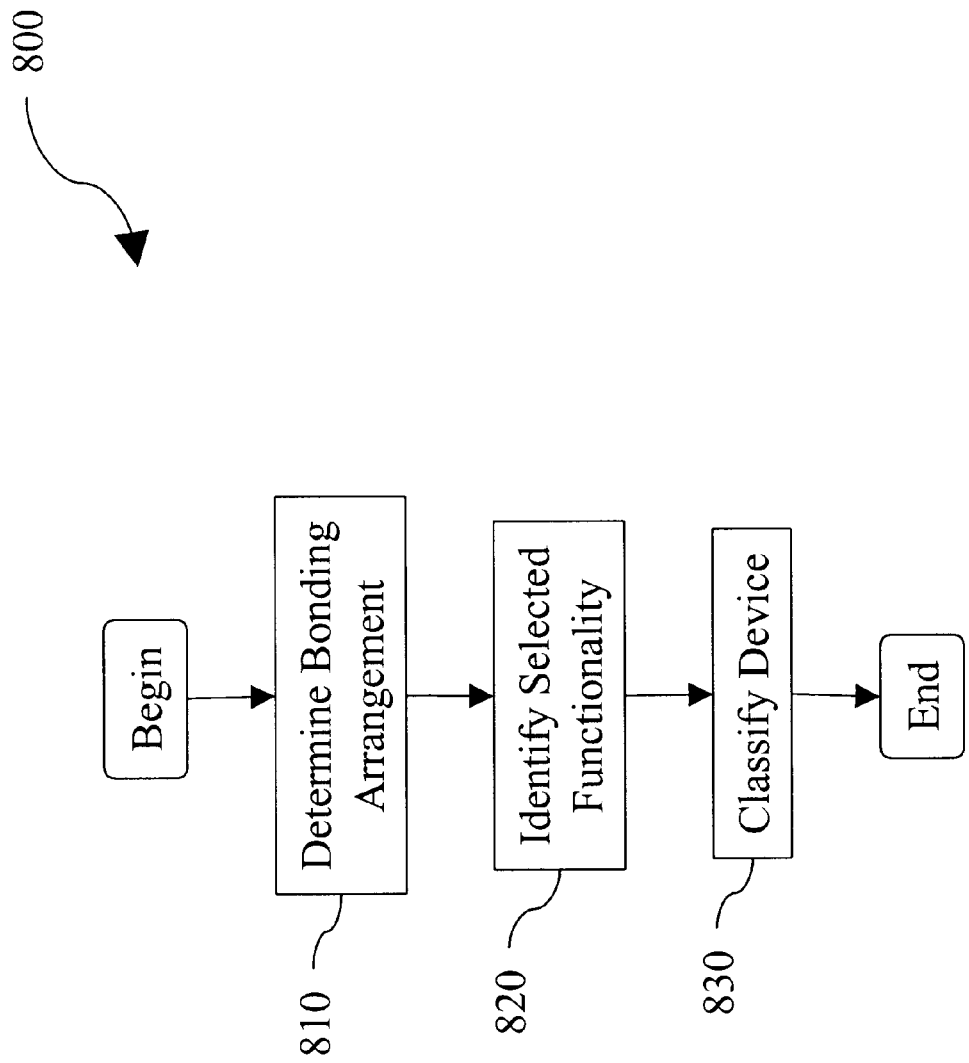

SELECTION OF FUNCTIONS WITHIN AN INTEGRATED CIRCUIT

BACKGROUND

1. Technical Field

The present invention relates generally to semiconductor devices; and, more particularly, it relates to functionality identification and selection within a semiconductor device.

2. Description of Prior Art

Semiconductor devices inherently have fixed and limited output pin budgets. That is to say, on any given die, there are a finite number of output pins that may be used for various purposes depending on the functionality of the semiconductor device. There exists an inherent design constraint in optimal allocation of these pins in a semiconductor device. Furthermore, there is a difficulty in accommodating a variety of devices having different functionality using a single die. The development of the semiconductor industry has led to an intrinsic bottleneck in device design, in that, while multiple and increased functionality density may now be achieved on the semiconductor device real estate that in previous years, there nevertheless still exists the limited number of input/output pins for the semiconductor device.

Compounding such problems, in typical, a conventional design solution is to reserve a number of General Purpose Input/Output (GPIO) pins in a given semiconductor device's design to permit quick response to a particular customer's needs for new features. These GPIOs may be reserved to correct functional problems of the semiconductor device. This reservation of sometimes numerous pins, on a device that is already limited in number of total available pins, presents a design trade-off in the semiconductor device's layout and implementation. For many customers, the reserved pins may go completely unused, sometimes significantly limiting the functionality of the semiconductor device. Semiconductor device design engineers are typically reluctant to surrender these GPIOs for uses that may not be used by a majority of customers. This inherently pin consumptive solution, in reserving multiple GPIOs, works against providing increased functionality for a semiconductor device. Furthermore, reserving multiple GPIOs can add package cost by forcing the semiconductor device to be housed in a package capable of containing the extra pins.

Two common conventional solutions are used to attempt to provide multiple functionality for a given semiconductor device having a finite number of available pins. One of the conventional solutions involves simply removing other pins after prioritizing the necessity of the pins to meet a majority of customer needs. Typically, the pins ranking near the lower end of the prioritization are GPIOs or power pins. Often several of the multiple power pins are eliminated in exchange for an internal common power plane throughout the device that is supplied via a single or reduced number of pins. This potentially reduces noise immunity by increasing the inductance and resistance of the semiconductor device's power plane relative to the printed circuit board's power plane. Certain conventional semiconductor devices exchange GPIO pins and use them for selecting functionality within the semiconductor device. A common implementation is the connection of the select pin to either an elevated potential or a ground potential. In addition, multiple select output pins can be multiplexed to provide for even increased functionality, e.g., two pins may be used to provide for four different functions, three pins to provide for eight, etc.

Another conventional solution implements bonding options within the internal real estate of the semiconductor device. A typical implementation of this employs multiple select pads that are connected to an elevated potential via a pull-up resistor. The pad that is used for selecting a particular function is down-bonded to the leadframe of the semiconductor device internally, and the leadframe is connected to an external ground potential. A distinct disadvantage is this conventional solution is the requirement to dedicate valuable real estate of the semiconductor device for these pull-up resistors; it is inherently space consumptive. Also, a special kind of bonding pad is required to accommodate the connection to the leadframe. Resistor tolerance issues and problems further complicate this conventional solution by the introduction of the pull-up resistors internal to the semiconductor device.

Further limitations and disadvantages of conventional and traditional systems will become apparent to one skilled in the art through comparison of such systems with the present invention as set forth in the remainder of the present application with reference to the drawings.

SUMMARY OF THE INVENTION

Various aspects of the present invention can be found in a functionality selection system that selects at least one function from a plurality of functions within a device. The device is commonly a semiconductor device capable of performing a plurality of functions. These functions are embedded in the semiconductor device. A function selector is employed that selects at least one function. If desired, one or more additional selectors select more than one function thereby providing a multi-functional semiconductor device. Furthermore, the one or more selectors collectively select one or more functions of the semiconductor device in certain embodiments of the invention.

The selector is a pad placed internal to the semiconductor device in one embodiment of the invention. The pad is strategically placed between a first pad having a first potential and a second pad having a second potential. The pad is bonded either to the first pad or the second pad. Alternatively, the pad is double bonded to a pin to which either the first pad or the second pad is bonded. The bonding of the pad to either the first pad, the second pad, or to the pin occurs prior to encapsulation of the semiconductor device.

In addition, various aspects of the present invention can be found in a device identification system that uses at least one function from a plurality of functions within a device. The semiconductor device having a certain functionality is placed within the device identification system for identification. The device identification system is used to identify and classify the semiconductor device.

Another aspect of the invention is found in a security system that couples a specific software to a specific hardware. In one embodiment, the invention serves as a key that ensures that the specific software is not loaded indiscriminately on just any given hardware. In other words, even though the semiconductor device is capable of many functions, by bonding a select pad in order to disable a function in the semiconductor device, the software will be prevented from running.

Another aspect of the invention is found in a method that selects at least one function from a plurality of functions within a device. The method involves a plurality of functions embedded in a device, and the method then selects at least one function from the plurality of functions. The selection of the at least one function is performed using a function selector. In certain embodiments of the invention, the function selector is a pad that is bonded to another pad having a ground or other voltage potential.

Another aspect of the invention is found in a method that identifies the device using the selected at least one function. In this embodiment, the semiconductor device is analyzed and classified using the selected at least one function.

Other aspects, advantages and novel features of the present invention will become apparent from the following detailed description of the invention when considered in conjunction with the accompanying drawings.

BRIEF DESCRIPTION OF DRAWINGS

FIG. 8 is a functional block diagram depicting the present invention that, in one embodiment, determines a bonding arrangement within a device.

DETAILED DESCRIPTION OF DRAWINGS

Figure 1:
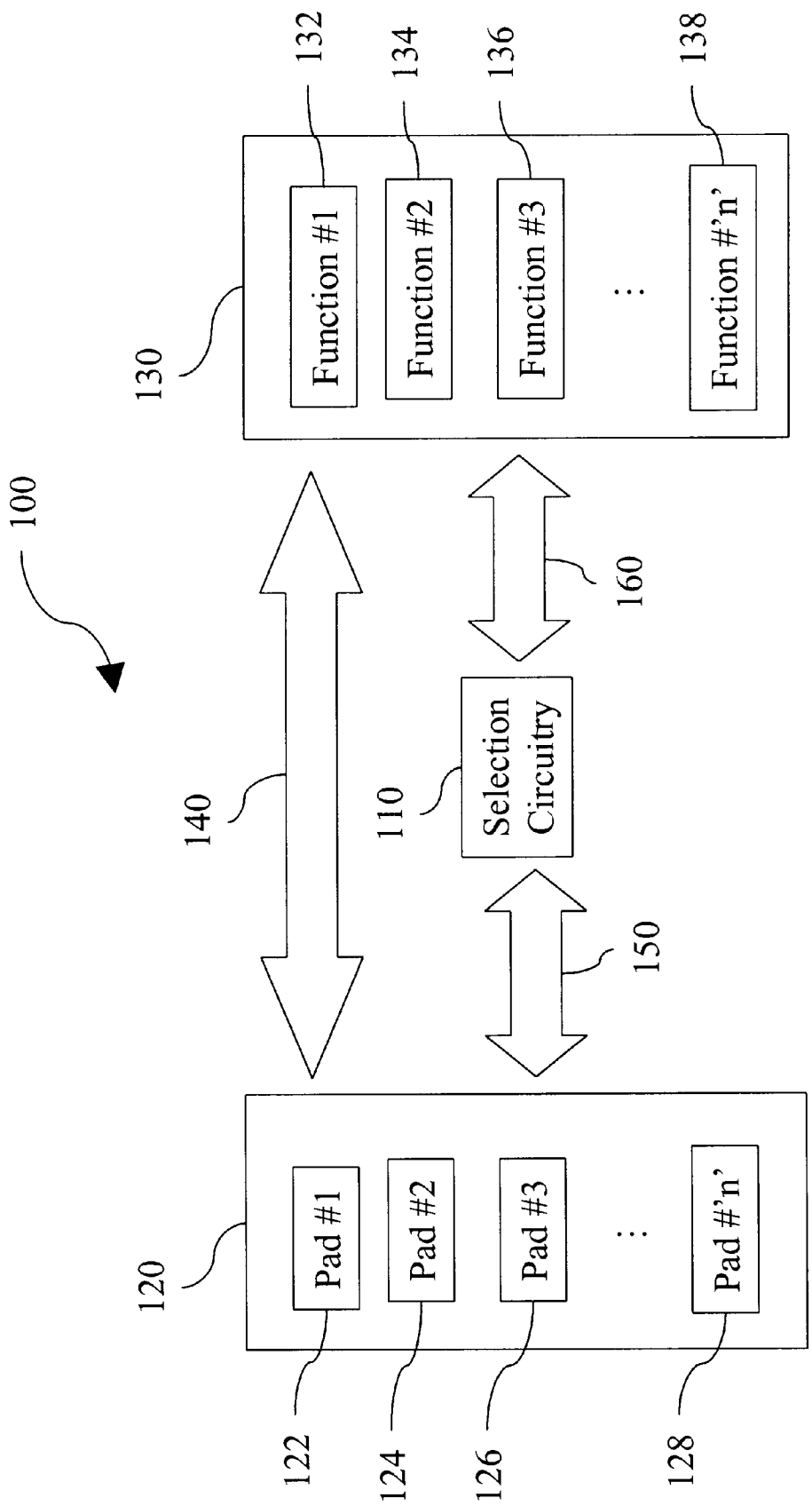
FIG. 1 is a system diagram depicting the present invention that, in one embodiment, is a functionality selection system.

FIG. 1 is a system diagram 100 depicting the present invention that, in one embodiment, is a functionality selection system. A selection circuit 110 operates cooperatively with a plurality of bonding pads 120 and a plurality of functions 130. The plurality of functions 130 is embedded within an integrated circuit. The particular functionality of the functionality selection system is determined by the arrangement and selection of which of the plurality bonding pads 120 are connected to which of the plurality of functions 130 within the integrated circuit. Certain of the individual bonding pads 122, 124, 126 and 128 may be connected directly to certain of the individual functions 132, 134, 136 and 138 directly through a connection 140. Alternatively, certain of the individual bonding pads 122, 124, 126 and 128 may be connected directly to certain of the individual functions 132, 134, 136 and 138 indirectly through a connection 150 and a connector 160 through the selection circuit 110.

The selection circuit 110 contains internal selection logic within certain embodiments of the invention. The particular functionality of the functionality selection system is determined by the arrangement of the specific connections between the individual bonding pads 122, 124, 126 and 128 and the individual functions 132, 134, 136 and 138. As described above, there are numerous permutations in which the individual bonding pads 122, 124, 126 and 128 may be connected to the individual functions 132, 134, 136 and 138 either directly through the connection 140 or indirectly through the connection 150 and the connection 160 using the selection circuit 110.

Figure 2:
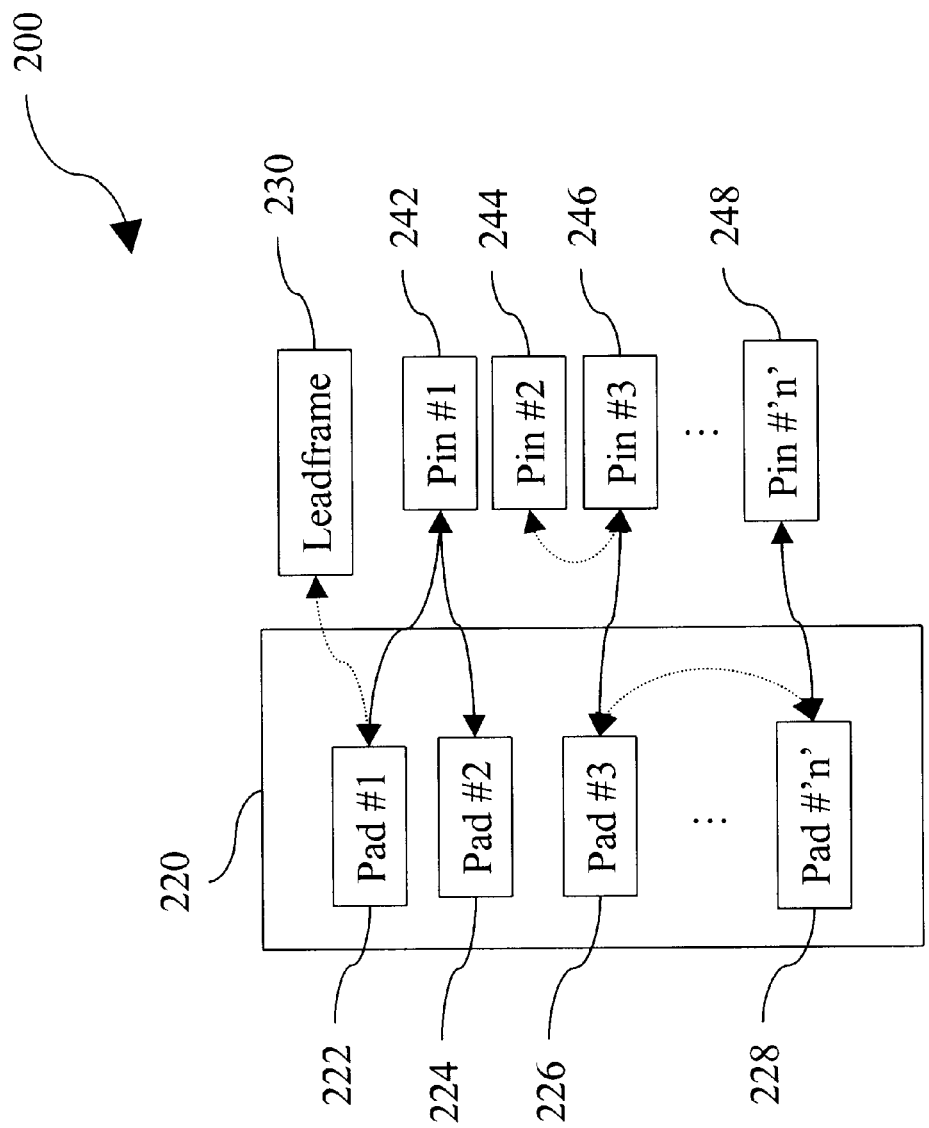
FIG. 2 is a system diagram depicting one embodiment of the functionality selection system described in FIG. 1.

FIG. 2 is a system diagram 200 depicting one embodiment of the functionality selection system described in FIG. 1. An integrated circuit 220 contains a plurality of bonding pads (222, 224, 226 and 228). Certain of the bonding pads 222–228 are connected to a leadframe of the integrated circuit 230, or alternatively to pins of the integrated circuit (242, 244, 246 and 248). Certain of the bonding pads 222–228 are connected to additional elements (not shown) in other embodiments of the invention. Specifically, the bonding pad #1 222 is connected to the pin #1 242. Similarly, the bonding pad #2 224 is also connected to the pin #1 242. The connection constitutes a double bonding on the pin #1 242. An alternative connection between the bonding pad #1 222 and the leadframe 230 is shown in FIG. 2. Depending on the particular arrangement of bonding pads to either the leadframe 230, the pins of the integrated circuit 242–248, or additional elements (not shown), the functionality of the integrated circuit is selected. A pad #3 226 is connected to a pin #3 246 and a pad #'n' 228 is connected to a pin #'n' 248.

The alternative connection between the pin #2 244 and the pin #3 246 is shown. Similarly, the alternative connection between the pad #3 226 and the pad #'n' 228 is shown. Those having skill in the art will recognize that the particular manner of performing the connections between the bonding pads 222–228 and the pins of the integrated circuit 242–248 and the leadframe 230 and additional elements (not shown) may be achieved in any manner known in the art for maintaining electrical connections. Examples of such methods of maintaining electrical connections are double bonding, connections on a printed circuit board (PCB) on which the integrated circuit is mounted, pin-to-pin connections, pad-to-pad connections, etc. These various methods of connecting the bonding pads 222–228 and the pins of the integrated circuit 242–248 and the leadframe 230 and additional elements (not shown) are included in the scope and spirit of the invention as shown by the various methods of connection in FIG. 2.

Figure 3:
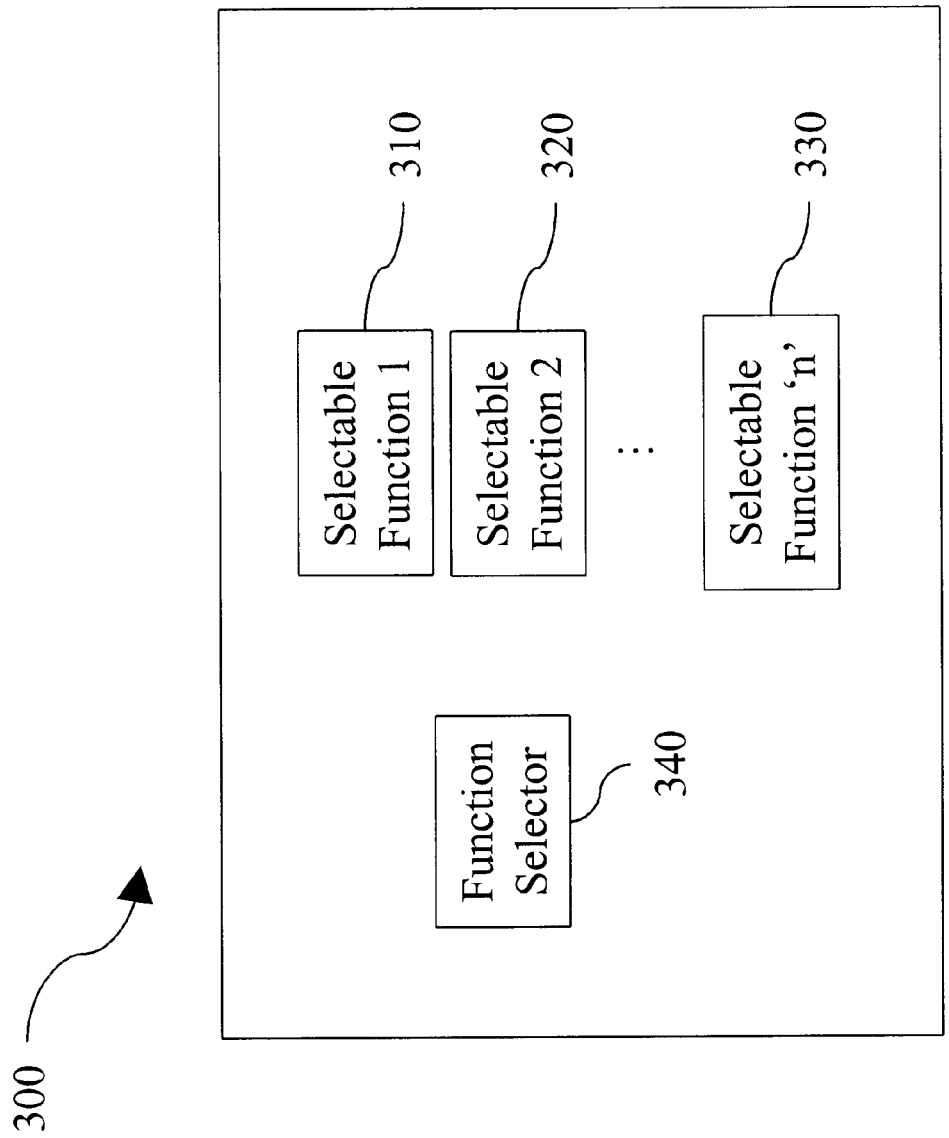
FIG. 3 is a system diagram illustrating one particular embodiment of a functionality selection system built in accordance with the present invention.

FIG. 3 is a system diagram illustrating one particular embodiment of a functionality selection system 300 built in accordance with the present invention. The functionality selection system 300 has multiple selectable functions, i.e. selectable function 1 310, selectable function 2 320, . . . selectable function 'n' 330. In addition, the functionality selection system 300 has a function selector 340 that selects from among the multiple selectable functions 310–330. In certain embodiments, the functionality selection system 300 selects only one function from among the multiple selectable functions 310–330, and in other embodiments of the invention, the functionality selection system 300 selects more than one function from among the multiple selectable functions 310–330. Various implementations of the functionality selection system 300 will be more fully understood after considering the various embodiments shown in the following figures.

Figure 4:
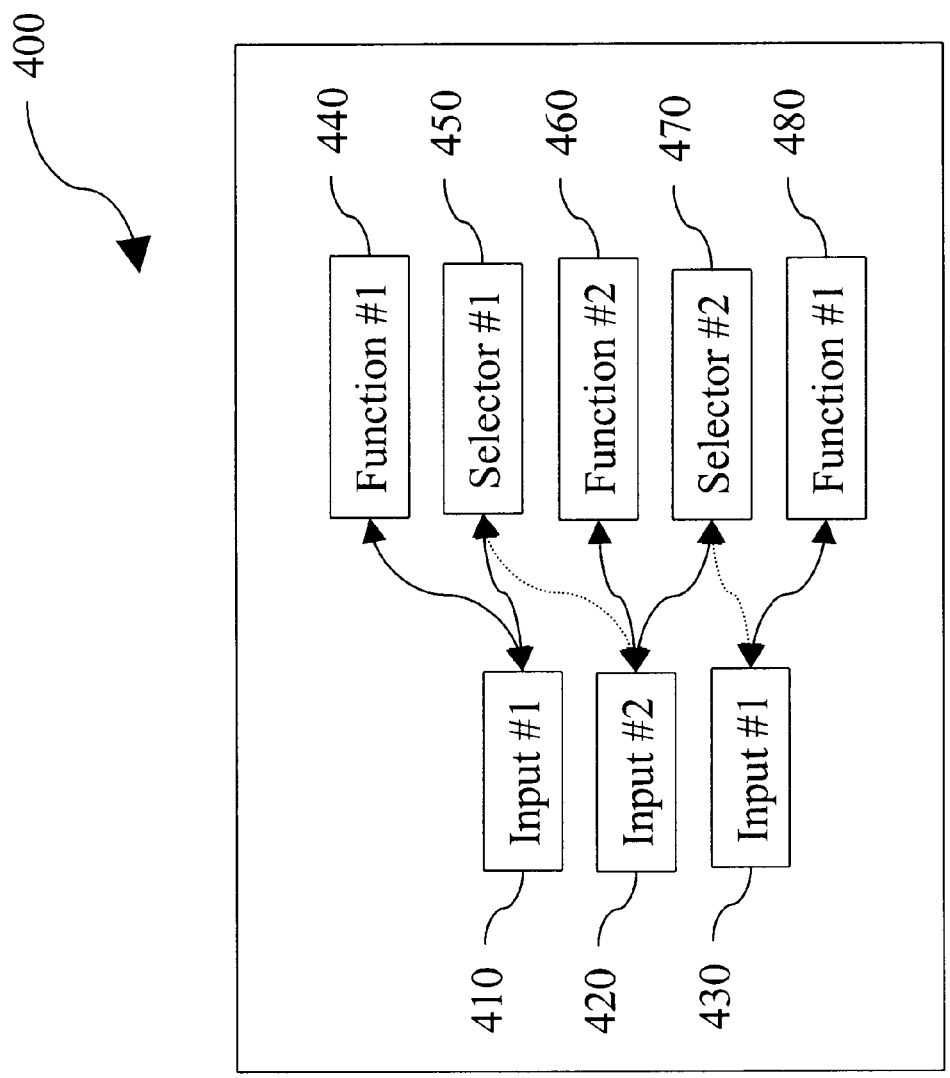
FIG. 4 is a system diagram illustrating another embodiment of a functionality selection system built in accordance with the present invention.

FIG. 4 is a system diagram illustrating another embodiment of a functionality selection system 400 built in accordance with the present invention. The functionality selection system 400 has three separate inputs, two of which have a common input value, i.e. input #1 410, input #2 420, and input #1 430. In this particular embodiment, input #1 410 and input #1 430 have the same value, yet they are physically two separate inputs. The functionality selection system 400 is viewed as having an input region represented by the inputs (input #1 410, input #2 420, and input #1 430) and an operation region represented by various function blocks and selectors blocks. Function #1 440 is communicatively coupled to input #1 410, and selector #1 450 is also communicatively coupled to input #1 410. In certain embodiments of the invention, this dual connection is performed using a double bonding technique wherein the double bonding is performed on the input #1 410. Alternatively, the dual connection is performed by communicatively coupling function #1 440 and selector #1 450. In other embodiments of the invention, the selector #1 450 is communicatively coupled to input #2 420. This alternative connection would serve to permit the functionality selection system 400 to select an alternative functionality.

Function #2 460 is communicatively coupled to input #2 420, and selector #2 470 is also communicatively coupled to input #2 420. In certain embodiments of the invention, this dual connection is performed using a double bonding technique wherein the double bonding is performed on the input #2 420. Alternatively, the dual connection is performed by communicatively coupling function #2 460 and selector #2 470. In other embodiments of the invention, the selector #2 470 is communicatively coupled to input #1 430. This alternative connection would serve to permit the functionality selection system 400 to select an alternative functionality.

Function #1 480 is communicatively coupled to input #1 430. In certain embodiments of the invention, the selector #1 450 and the selector #2 470 collectively select the functionality within the functionality selection system 400. The alternative connections between selector #1 450 and input #2 420 as well as between selector #2 470 and input #1 430 provide for increased functional selection among various functions within the functionality selection system 400.

Figure 5:
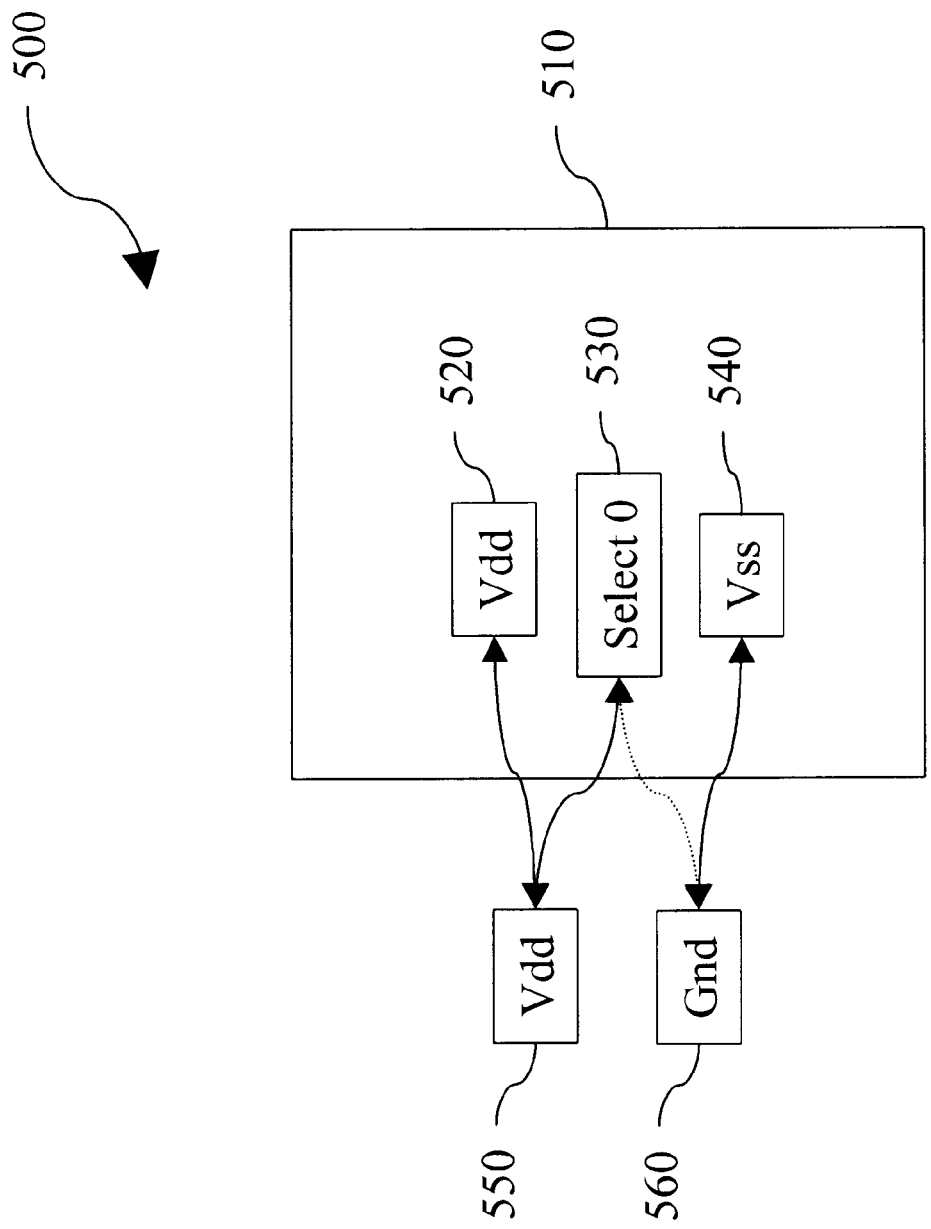
FIG. 5 is a system diagram illustrating another embodiment of a functionality selection system built in accordance with the present invention.

FIG. 5 is a system diagram illustrating another embodiment of a functionality selection system 500 built in accordance with the present invention. The functionality selection system 500 has a semiconductor device 510 having an internal Vdd pad 520. In certain embodiments of the invention, the internal Vdd pad 520 represented an elevated DC (direct current) voltage of either +5 volts, +3 volts, +2.5 volts, or +1.8 volts. The internal Vdd pad 520, which is located internal to the semiconductor device 510, is bonded to an external Vdd source 550. A select 0 pad 530 serves to perform the selection within the functionality selection system 500. The select 0 pad 530, which is located internal to the semiconductor device 510, is similarly bonded to an external Vdd source 550. Alternatively, the select 0 pad 530 is bonded to an external Gnd source 560, which is a source having a ground potential. The alternate selection of the external Gnd (Ground) source 560 in contrast to the external Vdd source 550 serves to select an alternate functionality. An internal Vss pad 540, which is located internal to the semiconductor device 510, is bonded to the external Gnd source 560.

Figure 6:
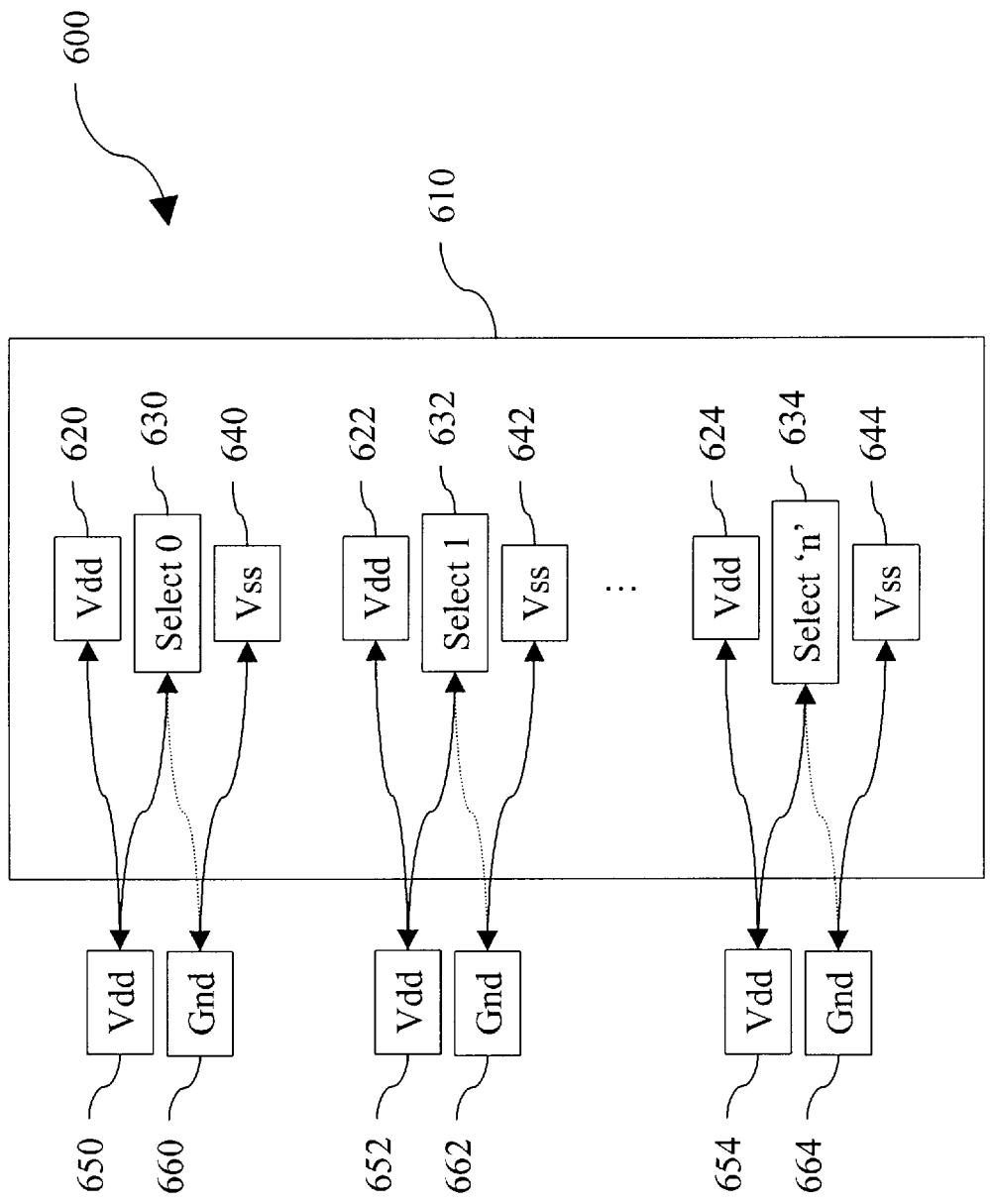
FIG. 6 is a system diagram illustrating another embodiment of a functionality selection system built in accordance with the present invention.

FIG. 6 is a system diagram illustrating another embodiment of a functionality selection system 600 built in accordance with the present invention. In one perspective, the functionality selection system 600 is a multiplexed representation of the functionality selection system 500. The functionality selection system 600 has a semiconductor device 610 having an internal Vdd pad 620. In certain embodiments of the invention, the internal Vdd pad 620 represented an elevated DC voltage of either +5 volts, +3 volts, +2.5 volts, or +1.8 volts. The internal Vdd pad 620, which is located internal to the semiconductor device 610, is bonded to an external Vdd source 650. A select 0 pad 630 serves to perform the selection within the functionality selection system 600. The select 0 pad 630, which is located internal to the semiconductor device 610, is similarly bonded to an external Vdd source 650. Alternatively, the select 0 pad 630 is bonded to an external Gnd source 660, which is a source having a ground potential. The alternate selection of the external Gnd source 660 in contrast to the external Vdd source 650 serves to select an alternate functionality. An internal Vss pad 640, which is located internal to the semiconductor device 610, is bonded to the external Gnd source 660.

Similarly, the functionality selection system 600 has a semiconductor device 610 having an internal Vdd pad 622. In certain embodiments of the invention, the internal Vdd pad 622 represented an elevated DC voltage of either +5 volts, +3 volts, +2.5 volts, or +1.8 volts. The internal Vdd pad 622, which is located internal to the semiconductor device 610, is bonded to an external Vdd source 652. A select 1 pad 632 serves to perform the selection within the functionality selection system 600. The select 1 pad 632, which is located internal to the semiconductor device 610, is similarly bonded to an external Vdd source 652. Alternatively, the select 1 pad 632 is bonded to an external Gnd source 662, which is a source having a ground potential. The alternate selection of the external Gnd source 662 in contrast to the external Vdd source 652 serves to select an alternate functionality. An internal Vss pad 642, which is located internal to the semiconductor device 610, is bonded to the external Gnd source 662.

Similarly, the functionality selection system 600 has a semiconductor device 610 having an internal Vdd pad 624. In certain embodiments of the invention, the internal Vdd pad 624 represented an elevated DC voltage of either +5 volts, +3 volts, +2.5 volts, or +1.8 volts. The internal Vdd pad 624, which is located internal to the semiconductor device 610, is bonded to an external Vdd source 654. A select 'n' pad 634 serves to perform the selection within the functionality selection system 600. The select 'n' pad 634, which is located internal to the semiconductor device 610, is similarly bonded to an external Vdd source 654. Alternatively, the select 'n' pad 634 is bonded to an external Gnd source 664, which is a source having a ground potential. The alternate selection of the external Gnd source 664 in contrast to the external Vdd source 654 serves to select an alternate functionality. An internal Vss pad 644, which is located internal to the semiconductor device 610, is bonded to the external Gnd source 664.

In one perspective, the various segments of the functionality selection system 600 may be viewed as individual selectors that operate collectively to select the overall functionality of the semiconductor device 610. The alternate connections provide even greater variety in performing selection of various functions within the semiconductor device 610.

Figure 7:
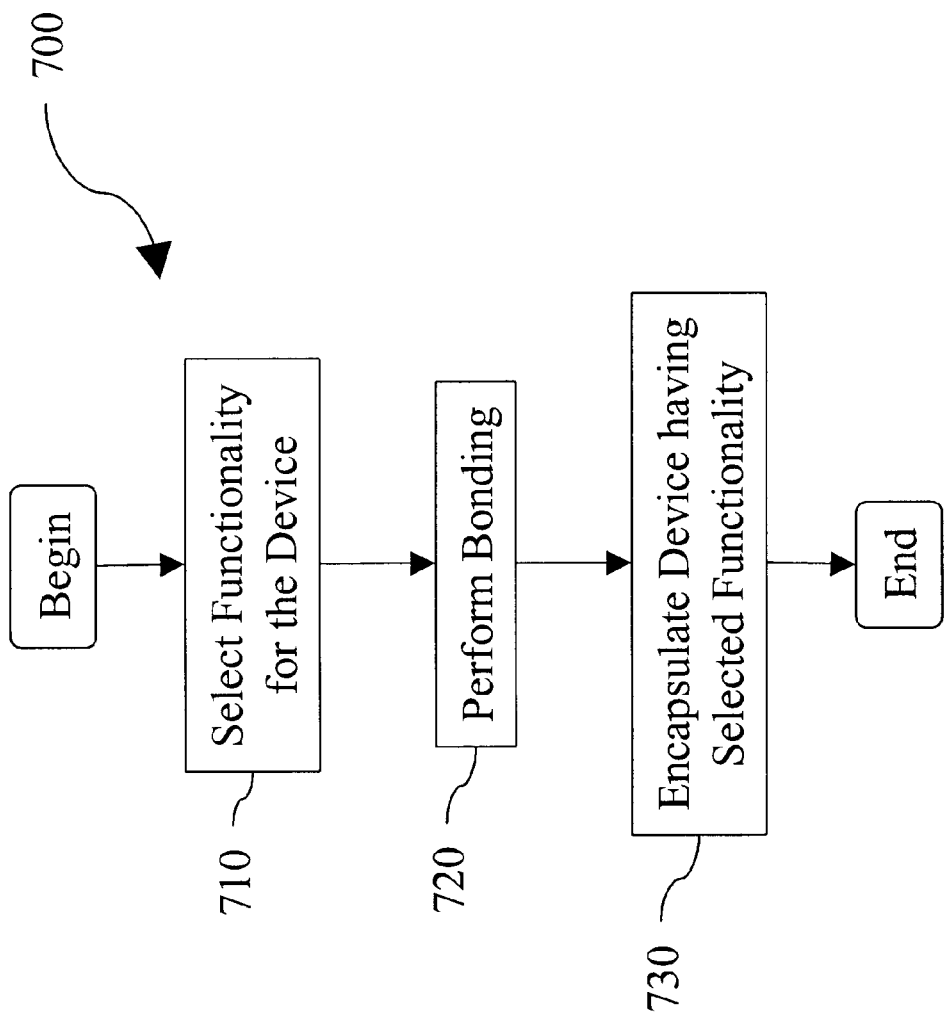
FIG. 7 is a functional block diagram depicting the present invention that, in one embodiment, selects a functionality of a device by implementing a bonding arrangement within a device.

FIG. 7 is a functional block diagram 700 depicting the present invention that, in one embodiment, selects a functionality of a device by implementing a bonding arrangement within a device. In a block 710, a particular functionality of a device is selected from among a plurality of functionalities. The device is typically an integrated circuit. In a block 720, a particular functionality of the device is implemented through performing a predetermined method of connecting at least one bonding pad within the integrated circuit. The functionality selected using the bonding pad is a single functionality in certain embodiments of the invention. In other embodiments of the invention, the functionality is a multiple functionality. In a block 730, the device is encapsulated. The encapsulation occurs subsequent to the predetermined method of connecting at least one bonding pad within the integrated circuit in the block 720. The functional block diagram 700 may be performed using any of the appropriate embodiments described in the figures above. However, those having skill in the art will appreciate that the method described in the functional block diagram 700 may alternatively be performed using functionality selection systems not explicitly enumerated here.

FIG. 8 is a functional block diagram 800 depicting the present invention that, in one embodiment, determines a bonding arrangement within a device. In the block 810, a device having an unknown bonding arrangement is analyzed to determine its bonding arrangement. The device is typically an integrated circuit and the determination of the bonding arrangement may be performed using external logic to analyze the integrated circuit, or the circuit may be analyzed by merely sampling the various pins of the integrated circuit during handshaking using a method known to those having skill in the art. In the block 820, a particular functionality of the device is identified as a function of the bonding arrangement that is identified in the block 810. The selected functionality is a single functionality in certain embodiments of the invention. In other embodiments of the invention, the selected functionality is a multiple functionality. In the block 830, the device is classified as to its functionality. The classification occurs subsequent to the identification of the selected functionality of the device in the block 820.

The classification performed in the block 830 is used to place the device into a particular sub-group of devices. In other embodiments of the invention, the classification performed in the block 830 is used to identify the precise and exact operation of the device. In still other embodiments of the invention, the classification performed in the block 830 is used by a first device to identify a second device when the two need to interface in the operation of a particular system. The classification of the second device by the first device may be required to perform proper communication or for the exchange of a proper communication protocol to initiate proper communication. The functional block diagram 800 may be performed using any of the appropriate embodiments described in the figures above. However, those having skill in the art will appreciate that the method described in the functional block diagram 800 may alternatively be performed using functionality identification systems not explicitly enumerated here.

In view of the above detailed description of the present invention and associated drawings, other modifications and variations will now become apparent to those skilled in the art. It should also be apparent that such other modifications and variations may be effected without departing from the spirit and scope of the present invention.

What is claimed is:

1. A semiconductor device, comprising:

an integrated circuit that comprises a plurality of pins and a plurality of bonding pads;

the integrated circuit is operable to perform a plurality of functions; and a function of the plurality of functions within the integrated circuit is selected by at least one of a direct pin to pin electrical connection between at least two pins of the plurality of pins and a direct pad to pad electrical connection between at least two pads of the plurality of pads, wherein the plurality of pads comprises a first internal pad, a second internal pad, a first select pad, a third internal pad, a fourth internal pad, and a second select pad;

the first select pad is located substantially between the first internal pad and the second internal pad; and the second select pad is located substantially between the third internal pad and the fourth internal pad;

wherein the first internal pad is directly connected to a first external ground source;

the first select pad is directly connected to at least one of the first internal pad and the second internal pad thereby creating a first direct electrical connection;

the third internal pad is directly connected to a second external ground source;

the fourth internal pad is directly connected to a second external elevated direct current voltage source;

the second select pad is directly connected to at least one of the third internal pad and the fourth internal pad thereby creating a second direct electrical connection; and the first direct electrical connection and the second direct electrical connection operate cooperatively to select the function from the plurality of functions.

2. A semiconductor device, comprising:

an integrated circuit that comprises a plurality of pins and a plurality of bonding pads;

the integrated circuit is operable to perform a plurality of functions; and a function of the plurality of functions within the integrated circuit is selected by at least one of a direct pin to pin electrical connection between at least two pins of the plurality of pins and a direct pad to pad electrical connection between at least two pads of the plurality of pads;

wherein the integrated circuit further comprises a lead frame; and a direct electrical connection between at least one of the pads of the plurality of pads operates cooperatively with the at least one of the direct pin to pin electrical connection between the at least two pins of the plurality of pins and the direct pad to pad electrical connection between the at least two pads of the plurality of pads to select the function from the plurality of functions.

* * * * *